United States Patent
Ko

(10) Patent No.: US 7,898,318 B2
(45) Date of Patent: *Mar. 1, 2011

(54) DATA OUTPUT CLOCK SIGNAL GENERATING APPARATUS AND SEMICONDUCTOR INTEGRATED CIRCUIT WITH THE SAME

(75) Inventor: Bok Rim Ko, Ichon (KR)

(73) Assignee: Hynix Semiconductor Inc. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/496,322

(22) Filed: Jul. 1, 2009

(65) Prior Publication Data

US 2009/0261889 A1    Oct. 22, 2009

Related U.S. Application Data

(63) Continuation of application No. 11/961,665, filed on Dec. 20, 2007, now Pat. No. 7,567,117.

(30) Foreign Application Priority Data

Jul. 11, 2007    (KR) .................. 10-2007-0069622

(51) Int. Cl.
    G05F 1/10    (2006.01)
(52) U.S. Cl. ........................... 327/535; 327/538

(58) Field of Classification Search ............... 327/535, 327/537, 538, 540, 541; 365/189.09, 210.12
See application file for complete search history.

(56) References Cited

U.S. PATENT DOCUMENTS

| 6,333,879 | B1 | 12/2001 | Kato et al. |
| 6,366,156 | B1 | 4/2002 | Narendra et al. |
| 6,446,180 | B2 | 9/2002 | Li et al. |
| 6,977,848 | B2 | 12/2005 | Choi |
| 6,987,705 | B2 | 1/2006 | Kim et al. |
| 7,027,336 | B2 | 4/2006 | Lee |
| 7,081,784 | B2 | 7/2006 | Kang |
| 7,495,982 | B2 | 2/2009 | Chi |

FOREIGN PATENT DOCUMENTS

| JP | 2004327008 | 11/2004 |
| KR | 1020010064539 | 7/2001 |
| KR | 1020070051062 | 5/2007 |

*Primary Examiner*—An T Luu
(74) *Attorney, Agent, or Firm*—Baker & McKenzie LLP

(57) ABSTRACT

A data clock control apparatus includes a bias voltage generator configured to receive a plurality of test mode signals and a plurality of fuse signals and to generate a bias voltage to secure a predetermined potential difference from an external driving power supply, and a clock signal controller configured to receive the bias voltage and to buffer an external clock signal and outputs a data output clock signal.

20 Claims, 7 Drawing Sheets

DATA OUTPUT CLOCK SIGNAL GENERATING APPARATUS AND SEMICONDUCTOR INTEGRATED CIRCUIT WITH THE SAME

CROSS-REFERENCES TO RELATED APPLICATION

This is a continuation application of application Ser. No. 11/961,665, filed on Dec. 20, 2007, now U.S. Pat. No. 7,567,117, which is incorporated herein by reference in its entirety, and which claims priority under 35 U.S.C. 119(a) to Korean Patent Application number 10-2007-0069622, filed on Jul. 11, 2007, in the Korean Intellectual Property Office, the contents of which are incorporated herein by reference in their entirety as if set forth in full.

BACKGROUND

1. Technical Field

The disclosure relates to a semiconductor integrated circuit and, more particularly, to a data output clock signal generating apparatus in a semiconductor integrated circuit that generates a stable data output clock signal.

2. Related Art

Conventional semiconductor integrated circuits, such as dynamic random access memories (DRAMs) and static random access memories (SRAMs), include data output buffers that output data read from a memory cell array to the outside of the semiconductor integrated circuit. As a result, data, which is synchronized with a data output clock signal, is output to an input/output pad via the data output buffer. The data output clock signal can be generated by delaying an external clock signal by a predetermined amount of time.

The external clock signal and the data output clock signal can share the same swing level, or range. That is, the voltage level of the external clock signal and the data output clock signal can have the same voltage range. Typical the range is from the voltage level of an external driving power supply, which is an operational upper-limit potential, to a voltage level of a ground terminal, which is an operational lower-limit potential.

In recent years, high speed operation has become a must for semiconductor integrated circuits, because most electronic equipment operates at a high speed. However, if the external driving power supply voltage is low, the external clock signal and the data output clock signal also operate in a low voltage range. This can negatively effect the data access time (hereinafter, referred to as 'tAC') for data that is output in synchronization with a data output clock having a low operational voltage level. Meanwhile, if the operational voltage is increased by a predetermined voltage to improve the tAC, it becomes difficult to satisfy a data hold time (hereinafter, referred to as 'tOH'), in which the data needs to be maintained for a predetermined amount of time to stably output the data.

SUMMARY

According to a one aspect, there is provided a data clock control apparatus that can include a bias voltage generator that can be configured to receive a plurality of test mode signals and a plurality of fuse signals and generate a bias voltage to secure a predetermined potential difference from an external driving power supply, and a clock signal controller that can receive the bias voltage, and can be configured to buffer an external clock signal and output a data output clock signal.

According to another aspect, there is provided a data clock control apparatus that can include a bias voltage generator that can be configured to generate a bias voltage that is adjusted by changing a voltage level according to a plurality of test mode signals and a plurality of fuse signals, which are activated, and a clock signal controller that can be supplied with the bias voltage, and can be configured to buffer an external clock signal and output a data output clock signal.

The bias voltage generator may include a first voltage adjusting unit that receives a first test mode signal and a first fuse signal and outputs a first drop voltage, a second voltage adjusting unit that receives a second test mode signal and a second fuse signal and outputs a second drop voltage, a voltage supply unit that supplies the bias voltage according to whether the first and second voltage adjusting units are activated or not, and a reference voltage generating unit that generates a reference voltage to activate the voltage supply unit.

The first voltage adjusting unit supplies the first drop voltage in response to an activated level of the first test mode signal or the first fuse signal. The second voltage adjusting unit supplies the second drop voltage in response to an activated level of the second test mode signal or the second fuse signal. The voltage supply unit is activated by the reference voltage, and supplies a voltage level, which is adjusted according to the operation of the first and second voltage adjusting units, as the bias voltage. The voltage supply unit includes an NMOS transistor, and the NMOS transistor includes a gate that is supplied with the reference voltage, a source that is connected to a bulk bias power supply, and a drain that supplies the bias voltage.

One end of the reference voltage generating unit is connected to an external driving power supply and the other end thereof is connected to a bulk bias power supply.

The bias voltage generator further includes a level shifter if an operation upper-limit potential of the bias voltage is a positive potential. The clock signal controller is supplied with the bias voltage at an operation lower-limit potential, and the clock signal controller includes a clock input buffer that receives and buffers the external clock signal and outputs an internal clock signal, and a pulse generator that receives the internal clock signal and outputs the data output clock signal as a pulse signal.

According to other aspect, there is provided a semiconductor integrated circuit that can include a data output clock generating unit that can be supplied with a bias voltage that is generated in response to a plurality of test mode signals and a plurality of fuse signals, and can be configured to buffer an external clock signal and output a data output clock signal, the bias voltage having a predetermined potential difference from an external driving power supply, and a data output buffer unit that can be configured to output data in synchronization with the data output clock signal and output the data stably even though a voltage of an external driving power supply is changed.

According to still other aspect, there is provided a semiconductor integrated circuit that can include a data output clock generating unit that can be supplied with a bias voltage whose voltage level is adjusted according to a plurality of test mode signals and a plurality of fuse signals, which are activated, and to output a data output clock signal, and a data output buffer unit that can be configured to output data in synchronization with the data output clock signal and output the data stably even though a voltage of an external driving power supply is changed.

The data output clock generating unit includes a bias voltage generator that receives the plurality of test mode signals and the plurality of fuse signals and generates the bias voltage, and a clock signal controller that buffers the external clock signal to output the data output clock signal and the bias voltage is applied at an operation lower-limit potential of the clock signal controller.

The bias voltage generator includes a first voltage adjusting unit that receives a first test mode signal and a first fuse signal and supplies a first drop voltage, a second voltage adjusting unit that receives a second test mode signal and a second fuse signal and supplies a second drop voltage, a voltage supply unit that supplies the bias voltage according to whether the first and second voltage adjusting units are activated or not, and a reference voltage generating unit that generates a reference voltage to activate the voltage supply unit. The first voltage adjusting unit supplies the first drop voltage in response to an activated level of the first test mode signal or the first fuse signal. The second voltage adjusting unit supplies the second drop voltage in response to an activated level of the second test mode signal or the second fuse signal. The voltage supply unit is activated by the reference voltage, and supplies a voltage level, which is adjusted according to the operation of the first and second voltage adjusting units, as the bias voltage. The voltage supply unit includes an NMOS transistor, and the NMOS transistor includes a gate that is supplied with the reference voltage, a source that is connected to a bulk bias power supply, and a drain that supplies the bias voltage.

One end of the reference voltage generating unit is connected to an external driving power supply and the other end thereof is connected to a bulk bias power supply. The bias voltage generator further includes a level shifter if an operation upper-limit potential of the bias voltage is a positive potential. The data output buffer unit includes: a pre driver that receives the data; and an output driver that is pulled up or pulled down according to an output signal of the pre driver and supplies the data to an input/output pad.

The data is read from memory cells according to an address signal that is input from the outside of the semiconductor integrated circuit.

These and other features, aspects, and embodiments are described below in the section entitled "Detailed Description."

DETAILED DESCRIPTION

Figure 1:
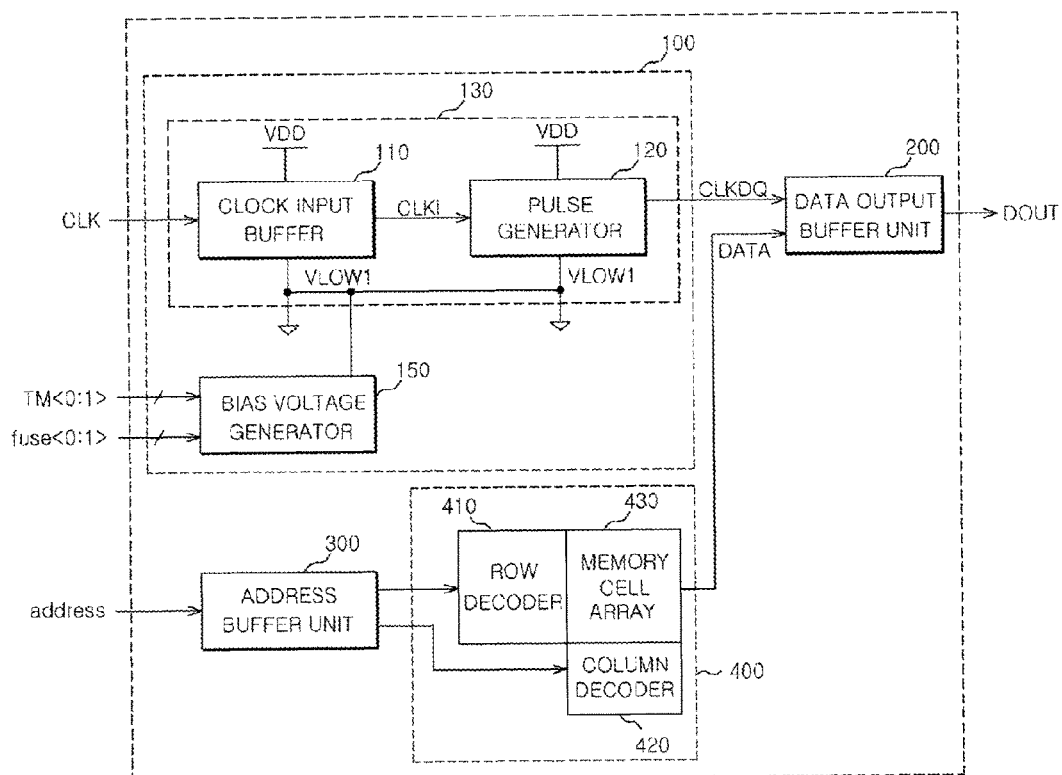
FIG. 1 is a block diagram illustrating a semiconductor integrated circuit according to one embodiment.

FIG. 1 is a diagram illustrating a semiconductor integrated circuit configured in accordance with one embodiment.

Referring to FIG. 1, it can be seen that the semiconductor integrated circuit 10 can include a data output clock signal generating unit 100, a data output buffer unit 200, an address buffer unit 300, and a memory cell block 400. The data output clock signal generating unit 100 can include a clock signal controller 130 and a bias voltage generator 150. Further, the clock signal controller 130 can include a clock input buffer 110 and a pulse generator 120.

Specifically, the clock input buffer 110 can be configured to buffer an external clock signal 'CLK' and output an internal clock signal 'CLKi'. The pulse generator 120 can receive the internal clock signal 'CLKi' and output a data output clock signal 'CLKDQ'.

The clock input buffer 110 and the pulse generator 120 can be supplied with a first bias voltage VLOW1 having a first voltage range. In one embodiment, the first voltage range may be a voltage range from −0.4 to 0 V. The first bias voltage VLOW1 is used as a biased voltage of the clock input buffer 110 and the pulse generator 120 instead of a ground voltage VSS. Therefore, the data output clock signal 'CLKDQ' can have a swing level (for example, a range from −0.4 to 1.6 V) that is tuned.

The bias voltage generator 150 can be configured to receive a plurality of test mode signals 'TM<0:1>' and a plurality of fuse signals 'fuse<0:1>' and to generate the first bias voltage VLOW1 with a predetermined potential difference from the external driving power supply VDD. For convenience of explanation, in this embodiment, it is assumed that the bias voltage generator 150 only generates the first bias voltage VLOW1. However, the bias voltage generator 150 can be configured to generate a second bias voltage VLOW2 (not shown) that has a different voltage range. The bias voltage generator 150 will be described in detail below.

The address buffer unit 300 can be configured to receive an address signal 'address' from the outside of the semiconductor integrated circuit and to temporarily store the received address signal. Row and column decoders 410 and 420 of the memory cell block 400 can be configured to decode the address signal 'address' stored in the address buffer unit 300. The data signal 'DATA' can be read from a specific memory cell of a memory cell array 430 designated by the decoded address, and can be transmitted to the data output buffer unit 200.

The data output buffer unit 200 can be configured to receive the data signal 'DATA' in synchronization with the data output clock signal 'CLKDQ', in which a swing level is adjusted and an operation speed is improved. The data output buffer unit 200 can be configured to provide an output signal 'DOUT' to a pad (not shown).

Figure 2A:
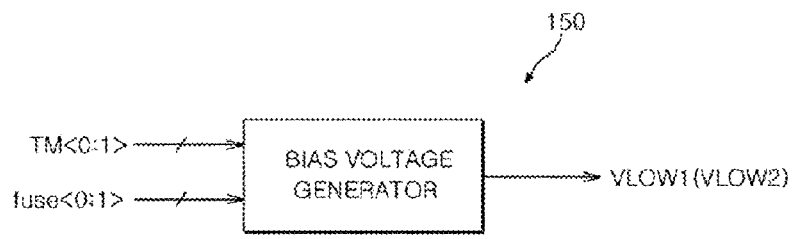
FIG. 2A is a block diagram illustrating a bias voltage generator that can be included in the circuit shown in FIG. 1.
Figure 2B:
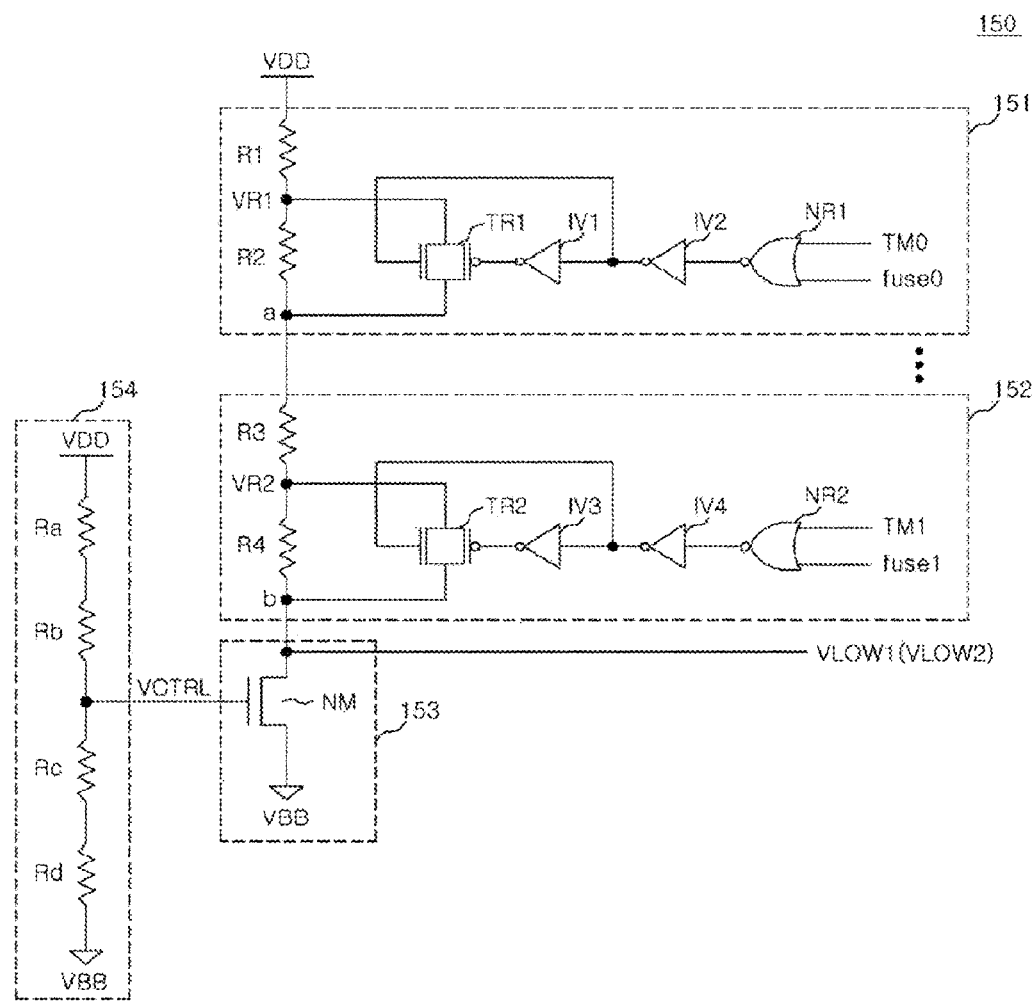
FIG. 2B is a circuit diagram illustrating the bias voltage generator shown in FIG. 2A.

Referring to FIGS. 2A and 2B, the bias voltage generator 150 will be described in detail. First, the bias voltage generator 150 can be configured to receive the plurality of test mode signals 'TM<0:1>' and the plurality of fuse signals 'fuse<0:1>' to output the first bias voltage VLOW1 having the first voltage range or the second bias voltage VLOW2 having the second voltage range. The bias voltage generator 150 can include a first voltage adjusting unit 151, a second voltage adjusting unit 152, a voltage supply unit 153, and a reference voltage generating unit 154 as illustrated in FIG. 2B.

Specifically, the first voltage adjusting unit 151 can be configured to receive a first test mode signal 'TM0' and a first fuse signal 'fuse0' and to supply a first drop voltage VR1. Therefore, the first voltage adjusting unit 151 can be said to be activated in response to an activate level of the first test mode signal 'TM0' or the first fuse signal 'fuse0'.

The first voltage adjusting unit 151 can include a first NOR gate NR1, a plurality of inverters IV1 and IV2, a first pass gate TR1, and first and second resistors R1 and R2. The first NOR gate NR1 can be configured to receive the first test mode signal 'TM0' or the first fuse signal 'fuse0' and to output a low-level signal in response to an activate, e.g., high-level first test mode signal 'TM0' or first fuse signal 'fuse0'. The first pass gate TR1 will then be turned on, and the first drop voltage VR1, which is dropped by the first resistor R1, will be supplied to a node a.

Meanwhile, the second voltage adjusting unit 152 can include a second NOR gate NR2, a plurality of inverters IV3 and IV4, a second pass gate TR2, and third and fourth resistors R3 and R4. Since the operation principle of the second voltage adjusting unit 152 is the same as that of the first voltage adjusting unit 151, the description thereof will be omitted. In this embodiment, the first and second voltage adjusting units 151 and 152 are exemplified as voltage tuning units, but the embodiments described herein are not necessarily so limited. In order to minutely adjust the voltage, two or more voltage tuning units can be provided depending on the needs of a particular implementation.

The voltage supply unit 153 can be activated by a reference voltage VCTRL, and configured to supply a voltage having a level adjusted according to whether the first or second voltage adjusting unit 151 or 152 are activated and thereby generate the first or second bias voltage VLOW1 or VLOW2. The voltage supply unit 153 can include an NMOS transistor NM. The NMOS transistor NM includes a gate that is supplied with the reference voltage VCTRL, a source that is connected to a bulk bias power supply VBB, and a drain that supplies the first or second bias voltage VLOW1 or VLOW2.

The reference voltage generating unit 154 includes a plurality of resistors Ra to Rd. One end of the reference voltage generating unit 154 is connected to an external driving power supply VDD and the other end thereof is connected to the bulk bias power supply VBB. Accordingly, a current path exists from the external driving power supply VDD to the bulk bias power supply VBB trough the reference voltage generating unit 154. Thus, the voltage drop across resistors Ra to Rd will generate the reference voltage VCTRL.

In another embodiment, a different reference voltage generating unit can be used to supply the reference voltage VCTRL.

Referring to FIG. 2B, the operation of the bias voltage generator 150 will be described. The NMOS transistor NM is turned on by the reference voltage VCTRL, and a current path from the external driving power supply VDD coupled with resistor R1 to the bulk bias power supply VBB coupled with the source of NMOS transistor NM is formed. In order to generate the first bias voltage VLOW1 that has a predetermined voltage range, the first test mode signal 'TM0' is applied. The first voltage adjusting unit 151 is activated, and supplies the first drop voltage VR1 to the node a. At this time, test mode signal 'TM1' can be inactive such that the second voltage adjusting unit 152 does not operate.

Meanwhile, the first test mode signal TM0 or the first fuse signal fuse0 may be applied as a signal that activates the first voltage adjusting unit 151. In this case, the first fuse signal 'fuse0' is not necessarily at an activated level. If a predetermined bias voltage is obtained after the first test mode signal 'TM0' is applied, the first fuse signal 'fuse0' is input at an activated level. The first fuse signal 'fuse0' is activated if a fuse is cut. That is, if the first test mode signal 'TM0' is applied and the predetermined bias voltage is obtained, the first fuse signal 'fuse0' can be applied by cutting the first fuse (not shown). This would normally occur when the circuit is in a packaged state.

The first voltage adjusting unit 151 will then be activated, but the second voltage adjusting unit 152 is not. Thus, the voltage at the drain of the NMOS transistor NM corresponds to the first drop voltage VR1. Of course, since the predetermined voltage drop is generated by the third and fourth resistors R3 and R4, the first bias voltage VLOW1 can have a voltage level different from that of the first drop voltage VR1. However, the value of the voltage, which is dropped by the resistors R3 and R4, can be reduced according to the resistance value of each of the resistors R1 to R4. Accordingly, when the first voltage adjusting unit 151 is activated, the first bias voltage VLOW1 will largely depend on the first drop voltage VR1.

If the voltage level of the first bias voltage VLOW1 is still not the desired voltage level, the second voltage adjusting unit 152 can also activated. The second drop voltage VR2 can be supplied to a node b by the activating second voltage adjusting unit 152. As such, the first bias voltage VLOW1 can be minutely adjusted by the first drop voltage VR1 and the second drop voltage VR2 while the first and second voltage adjusting units 151 and 152 are activated. Thus, for example, it is possible to supply the first bias voltage VLOW1 that has a voltage range, e.g., from −0.4 to 0 V, as described above.

Meanwhile, if the voltage level of the reference voltage VCTRL or the resistance values of the plurality of resistors R1 to R4 are changed, it is possible to supply the second bias voltage VLOW2 that has the second voltage range. In this case, the second bias voltage VLOW2 can, e.g., be in a voltage range from −0.2 to 0.2 V.

Figure 3A:
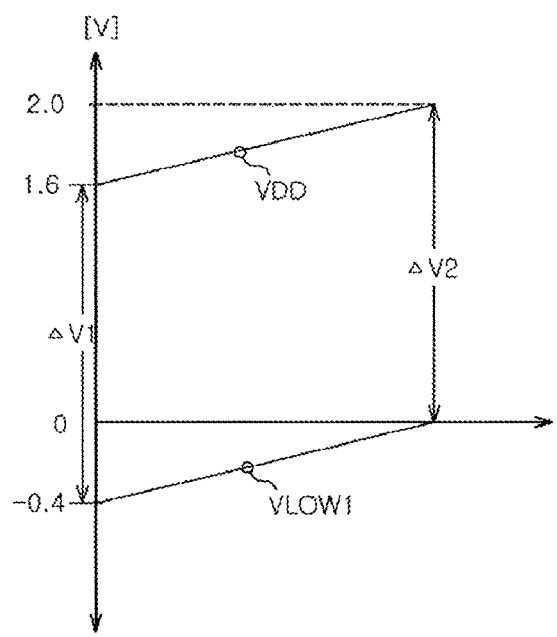
FIGS. 3A and 3B are graphs illustrating a bias voltage that is generated by the bias voltage generator shown in FIGS. 2A and 2B.

Referring to FIG. 3A, it will be understood that when the voltage of the external driving power supply VDD is changed from 1.6V to 2.0 V, the first bias voltage VLOW1 is changed from −0.4V to 0 V.

In a conventional system, the external clock signal 'CLK' and the data output clock signal 'CLKDQ' function in accordance with the swing level of the external driving power supply VDD and the swing level of the ground voltage VSS, respectively. The data output clock signal CLKD responds to the external clock signal 'CLK', which has a voltage level of the external driving power supply VDD, for example, 1.6 V. The data output clock signal 'CLKDQ', therefore, operates at a voltage level where the potential difference is reduced, and thus, the operation speed can be reduced. Accordingly, in order to output the data signal 'DATA' in synchronization with the data output clock signal 'CLKDQ', the tAC characteristic may be diminished. As explained above, if the operation upper-limit potential of the external clock signal 'CLK' is increased, the tOH characteristic, which is in a trade-off relation with the tAC characteristic, may be diminished.

However, in the embodiments described herein, if the voltage of the external driving power supply VDD is 1.6 V, then the first bias voltage VLOW1 has a voltage of −0.4 V, which is lower than a voltage of the ground voltage VSS in order to ensure a sufficient potential difference from the external driving power supply VDD. It can be assumed that the potential difference between the voltage of the external driving power supply VDD of 1.6 V and the first bias voltage VLOW1 is ΔV1 and the potential difference between the voltage of the external driving power supply VDD of 2.0 V and the corresponding first bias voltage VLOW1 is ΔV2. Each of the potential differences ΔV1 and ΔV2 is constant. In this embodiment, it is possible to generate the first bias voltage VLOW1 that varies according to a variation inclination of the external driving power supply VDD. If the first bias voltage VLOW1 is applied as the bias voltage of the data output clock signal 'CLKDQ' instead of the ground voltage VSS, it is possible to compensate for the potential difference loss that occurs when the external driving power supply VDD is reduced.

In other words, the first bias voltage VLOW1 can maintain a predetermined potential difference even though the voltage of the external driving power supply VDD is changed. The first bias voltage VLOW1 can then be applied to the data output clock signal 'CLKDQ' to improve the operation speed. As a result, it is possible to improve the timing margin at the time of outputting the data signal 'DATA'.

Figure 3B:
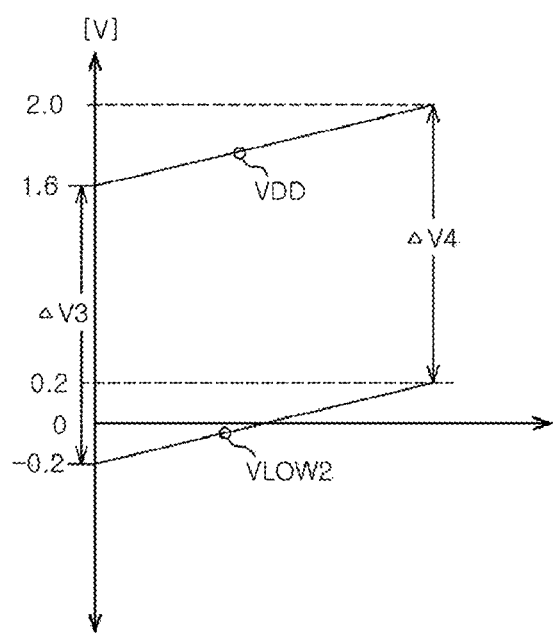

FIG. 3B exemplifies a second bias voltage VLOW2 that can be generated according to the same principle as that of FIG. 3A. FIG. 3B is different from FIG. 3A in that the second bias voltage VLOW2 is in a voltage range from −0.2 to 0.2 V, and the potential differences ΔV3 and ΔV4 are both 1.8 V, i.e., smaller than the 2.0 V that corresponds to the potential differences ΔV1 and ΔV2.

FIGS. 3A and 3B show that it is possible to generate the bias voltage that can reduce the potential difference according to the operational characteristics of the circuit. In this case, the numerical values are not important. The important thing is to generate the bias voltage so as to secure the predetermined potential difference even though the voltage of the external driving power supply VDD is changed.

Figure 4:
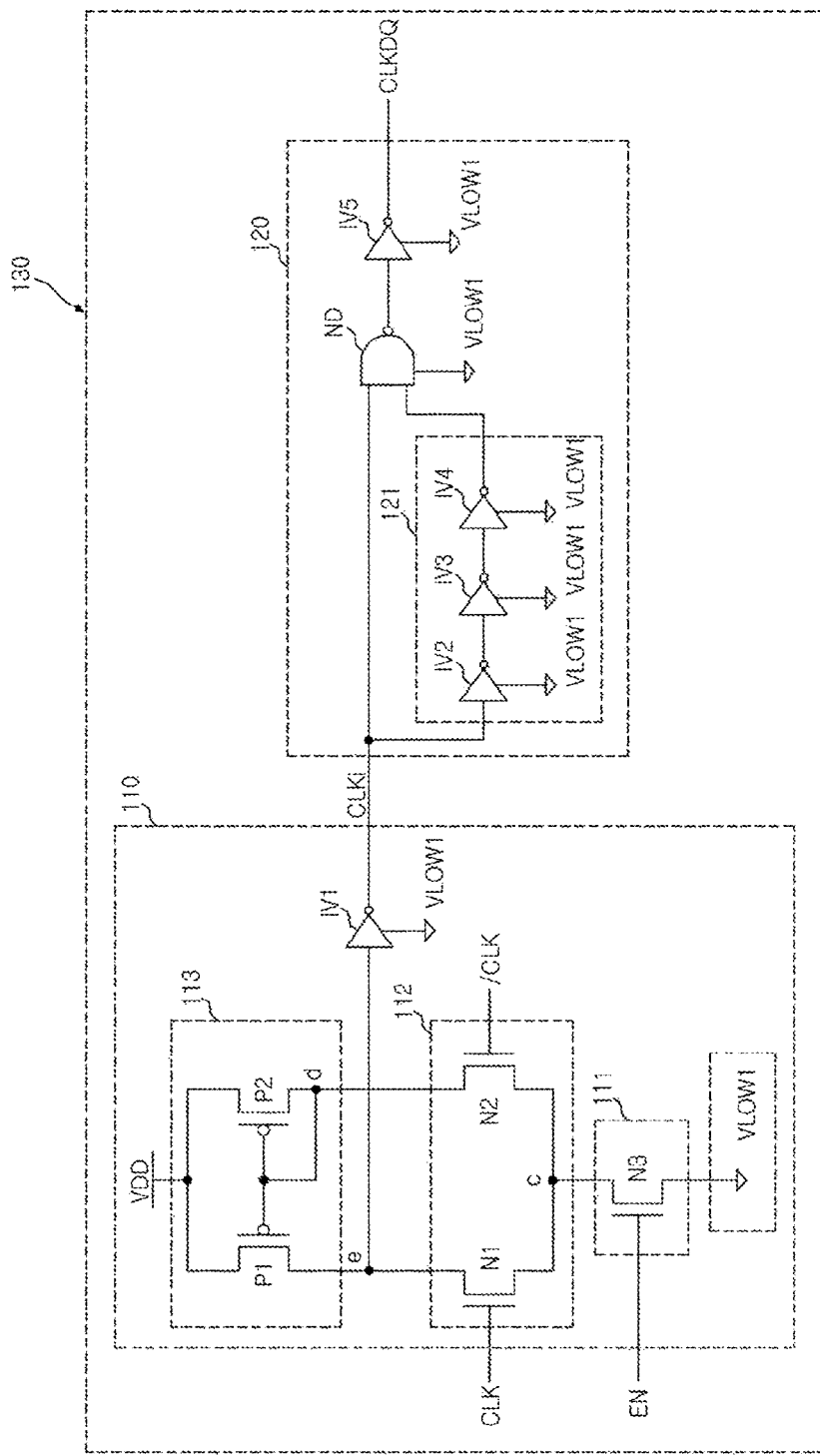
FIG. 4 is a circuit diagram illustrating a clock signal controller that can be included in the circuit shown in FIG. 1.

As shown in FIG. 4, the clock signal controller 130 can include the clock input buffer 110 and the pulse generator 120. The clock input buffer 110 can include a control unit 111, a clock signal receiving unit 112, and a current mirror unit 113. In this case, the clock input buffer 110 can be a common current-mirror-typed buffer, but the embodiments described herein are not limited thereto.

The control unit 111 can include a third NMOS transistor N3. The third NMOS transistor N3 can include a gate that receives an enable signal 'EN', a source that is connected to a terminal of the first bias voltage VLOW1, and a drain that is connected to a node c.

The clock signal receiving unit 112 can include first and second NMOS transistors N1 and N2. The first and second NMOS transistors N1 and N2 can be located opposite to each other, and gates of the first and second NMOS transistors N1 and N2 can receive the external clock signal 'CLK' and the inverted external clock signal '/CLK', respectively. In the first and second NMOS transistors N1 and N2, each source is connected to the node c and each drain is connected to the current mirror unit 113.

The current mirror unit 113 can include first and second PMOS transistors P1 and P2. Gates of the first and second PMOS transistors P1 and P2 are commonly connected to a node d, the sources thereof are commonly connected to the external driving power supply VDD, and the drains thereof are connected to the nodes e and d, respectively.

If the clock input buffer 110 receives the activated enable signal 'EN' at a high level, the third NMOS transistor N3 is turned on and operates. The clock input buffer 110 can output the internal clock signal 'CLKi' in response to the received external clock signal 'CLK'.

At this time, instead of the ground voltage VSS, the first bias voltage VLOW1 is connected. That is, the operation lower-limit potential of the clock signal controller 130 is biased in the range of the first bias voltage VLOW1. As a result, the predetermined potential difference can be ensured even though the voltage of the external driving power supply VDD is changed, and even though the external clock signal 'CLK' that has the low voltage swing level is input, it is possible to improve the speed at which the internal clock signal 'CLKi' corresponding to the external clock signal 'CLK' is generated.

The pulse generator 120 can be configured to receive the internal clock signal 'CLKi' and output the data output clock signal 'CLKDQ'. The pulse generator 120 can include a delay unit 121, a NAND gate ND, and a fifth inverter IV5. Further, the delay unit 121 can include a plurality of inverters IV2 to IV4. The pulse generator 120 can be configured to generate a signal in a type of a pulse according to the NAND operation of the NAND gate ND, which receives the internal clock signal 'CLKi' and the inverted and delayed internal clock signal 'CLKi'.

Also in the pulse generator 120, the first bias voltage VLOW1 is connected instead of the ground voltage VSS. As a result, even though the voltage of the external driving power supply VDD is changed, the predetermined potential difference is secured to compensate for the potential difference loss, and the data output clock signal 'CLKDQ', whose operation speed is improved, can be output.

Figure 5:
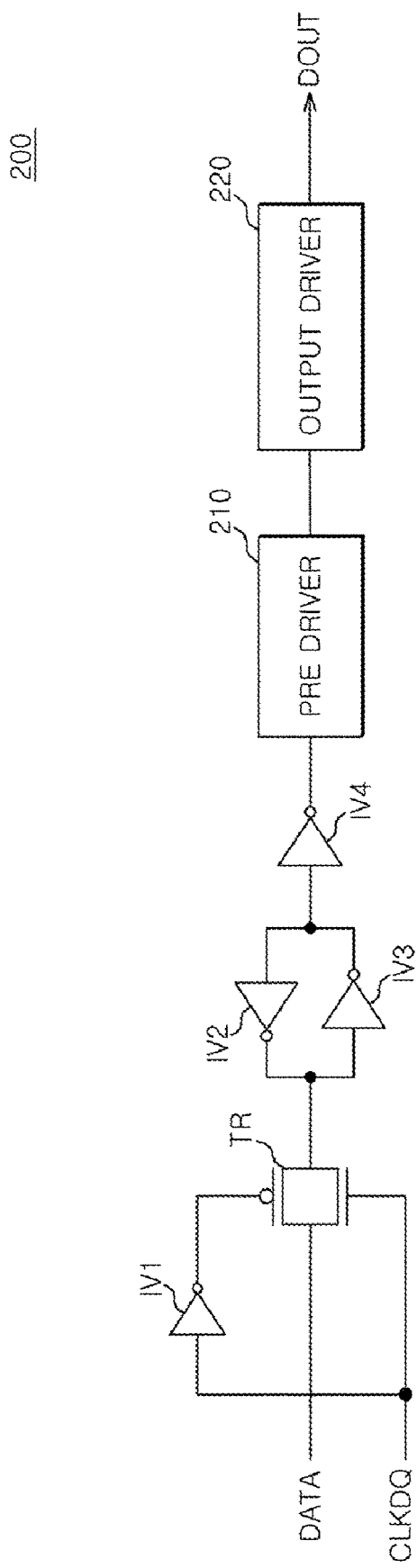
FIG. 5 is a block diagram illustrating a data output buffer unit.

Referring to FIG. 5, the data output buffer unit 200 can include a plurality of inverters IV1 to IV4, a pass gate TR, a pre driver 210, and an output driver 220. When the pass gate TR is turned on in response to the high level of the data output clock signal 'CLK', the data signal 'DATA' passes through the plurality of inverters IV2 to IV4 and is then transmitted to the pre driver 210.

The output driver 220 is pulled up or pulled down according to the output signal of the pre driver 210. As a result, the output driver 220 can output the data signal 'DATA' as the output signal 'DOUT' to an input/output pad (not shown).

As described above, even when the voltage of the external driving power supply VDD becomes a low voltage, it is possible to improve the margin characteristic of tAC when outputting the data signal 'DATA' by using the data output clock signal 'CLKDQ' that has secured the predetermined potential difference. Further, because the operational level of the data output clock signal 'CLKDQ' does not need to be increased to satisfy the tAC characteristic, the margin characteristic of tOH can be satisfied. As a result, it is possible to stably output the data signal 'DATA' even though the voltage of the external driving power supply VDD is changed.

Figure 6:
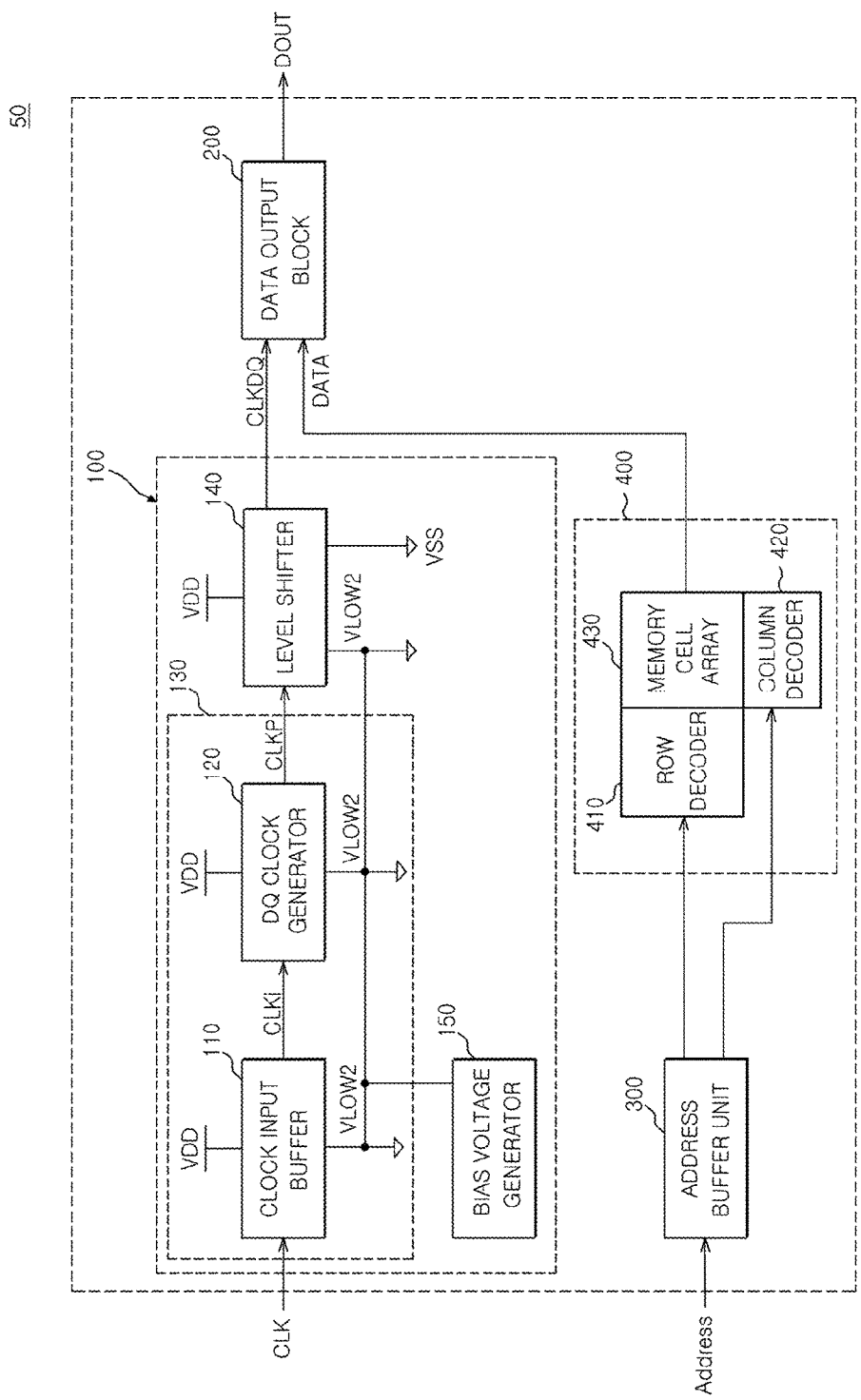
FIG. 6 is a block diagram illustrating a semiconductor integrated circuit according to another embodiment.

FIG. 6 is a block diagram illustrating a semiconductor integrated circuit 50 according to another embodiment of where a second bias voltage VLOW2 having a second voltage range is applied. In this case, the repetitive description for the same constituent elements as those in FIG. 1 is omitted, and only the different constituent elements are described.

The data output clock signal generating unit 100 includes a clock signal controller 130, a level shifter 140, and a bias voltage generator 150. Instead of the first bias voltage VLOW1, the second bias voltage VLOW2 is applied to the clock signal controller 130. In this case, it is assumed that the second bias voltage VLOW2 is in a voltage range from −0.2 to 0.2 V.

That is, according to another embodiment of the invention, the clock signal controller 130 outputs the clock pulse signal 'CLKP' in response to the external clock signal 'CLK'. The clock pulse signal 'CLKP' passes through the level shifter 140 and is then applied as the data output clock signal 'CLKDQ' that becomes an output reference for the data signal 'DATA'.

As described above, the operational upper-limit potential of the second bias voltage VLOW2 becomes a positive potential and the operational lower-limit potential thereof becomes a negative potential. The clock signal becomes an output reference of the data signal 'DATA' that has been applied with the operation upper-limit potential 0.2 V of the terminal of the second bias voltage VLOW2 connected instead of the ground voltage VSS.

At this time, it may be difficult for the clock signal to operate at a low level. Thus, when the second bias voltage VLOW2 is applied to the clock signal controller 130. The data output clock signal generating unit 100 further includes a level shifter 140 that shifts the voltage level to perform a stable operation. That is, the data output clock signal generating unit 100 outputs the data output clock signal 'CLKDQ', which has passed through the clock signal controller 130 and the level shifter 140 to which the second bias voltage VLOW2 is applied.

Figure 7:
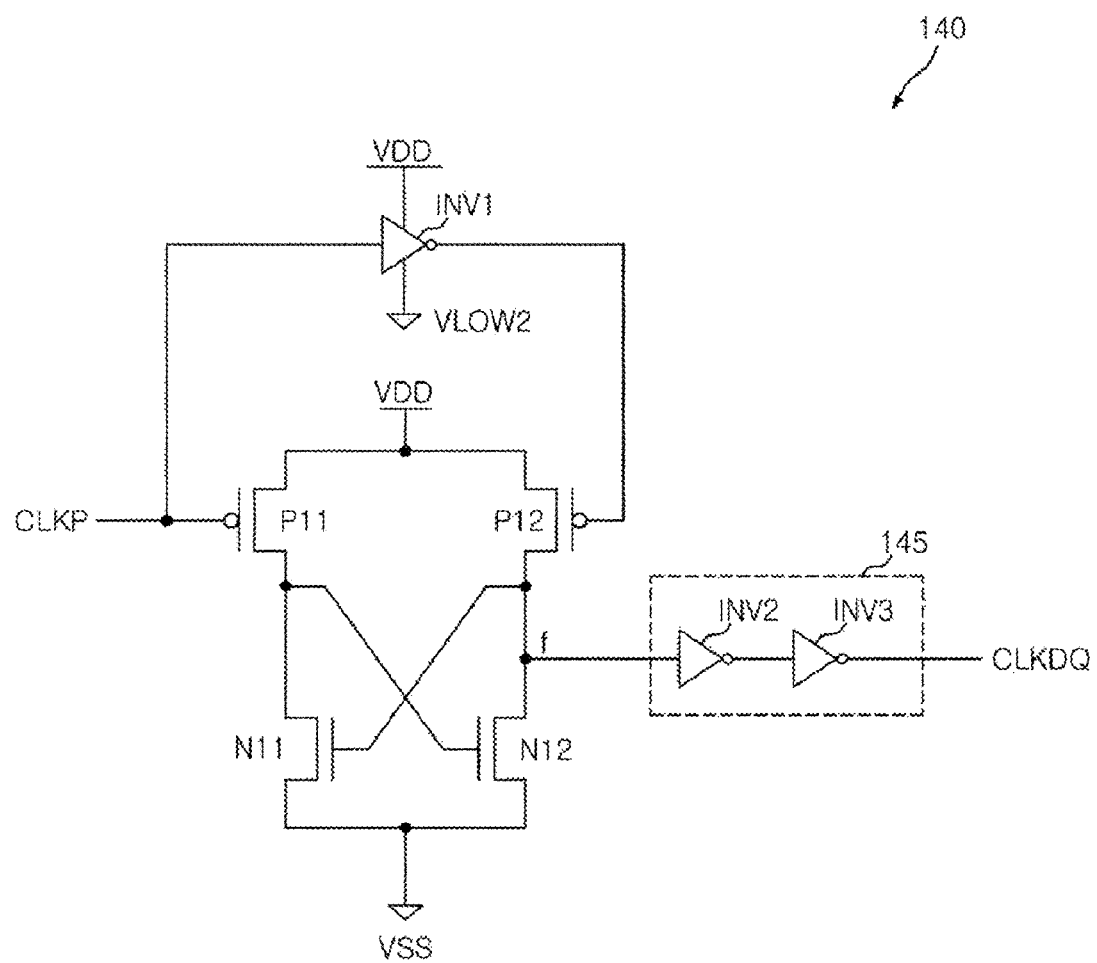
FIG. 7 is a circuit diagram illustrating a level shifter that can be included in the circuit shown in FIG. 6.

Referring to FIG. 7, the level shifter 140 can include first and second PMOS transistors P11 and P12 and first and second NMOS transistors N11 and N12, such that the level shifter 140 can receive the clock pulse signal 'CLKP' and the inverted clock pulse signal 'CLKP'. In this case, the first inverter INV1 inverts the clock pulse signal 'CLKP' and is supplied with the second bias voltage VLOW2. That is, each of the clock pulse signal 'CLKP' and the inverted clock pulse signal 'CLKP' can be applied with the second bias voltage VLOW2 so as to be input at the same swing level.

When the first or second PMOS transistor P11 or P12 are turned on in response to the clock pulse signal 'CLKP' that has the swing level of the voltage of the external driving power supply VDD or the swing level of the second bias voltage VLOW2, then the clock pulse signal 'CLKP' at the low level that is biased with the voltage of 0.2 V is generated.

In this case, if the first PMOS transistor P11 is turned on, the second NMOS transistor N12 is turned on, and the voltage level of a node f becomes the voltage level of the ground voltage VSS. This signal passes through the delay unit 145 and is output as the data output clock signal 'CLKDQ'.

At this time, the clock pulse signal 'CLKP' is a signal whose swing level is tuned and operation speed is improved. However, the voltage level of the second bias voltage VLOW2 that is biased to the clock pulse signal 'CLKP' is higher than the voltage level of the ground voltage VSS. Thus, the voltage level of the clock pulse signal 'CLKP' is shifted to the ground voltage VSS such that the stable operation is performed. Accordingly, the voltage level of the data output clock signal 'CLKDQ' can be set to 0 V. However, the data output clock signal 'CLKDQ' is level-shifted in response to the clock pulse signal 'CLKP' whose operation speed is improved and then transmitted. Therefore, the data output clock signal 'CLKDQ' is a signal whose operation speed is improved as compared with the data output clock signal 'CLKDQ' in a conventional system.

When the high-level clock pulse signal 'CLKP' is received, if the second PMOS transistor P12 that has received the inverted clock pulse signal 'CLKP' is turned on, the high-level signal is applied to the node f. Accordingly, the signal that has the same voltage level as the external driving power supply VDD can be applied as the data output clock signal 'CLKDQ'.

In other words, the level shifter 140 outputs the operation upper-limit potential of the clock pulse signal 'CLKP' as it is. However, the level shifter 140 level-shifts the lower-limit potential, which is biased and becomes higher voltage level than the ground voltage VSS, to the ground voltage VSS. Then, the level shifter 140 outputs the clock pulse signal 'CLKP' as the data output clock signal 'CLKDQ'.

As descried above, the bias voltage, which ensures the predetermined potential difference from the external driving power supply, is generated, and the data output clock signal or the clock pulse signal, to which the bias voltage is applied, is generated. If the data is output by using the data output clock signal or the clock pulse signal, the tAC characteristic can be improved. In order to improve the tAC characteristic of the data, all clock generating paths that can be used when outputting the data can be used as the path to which the bias voltage is applied.

According to the embodiments described herein, the bias voltage can be generated to have the predetermined voltage level that can secure the predetermined potential difference from the external driving power supply. The data output clock signal, to which the bias voltage level is applied, is generated. The data that is synchronized with the data output clock signal operates by the data output clock signal that secures the predetermined potential difference from the external driving power supply even though the voltage of the external driving power supply is low. Therefore, the tAC characteristic at the low voltage can be improved. Further, even though the voltage of the external driving power supply is a predetermined high voltage, the data operates by the data output clock signal that ensures the predetermined potential difference from the external driving power supply. Therefore, the tOH characteristic can be improved.

While certain embodiments have been described above, it will be understood that the embodiments described are by way of example only. Accordingly, the apparatus and methods described herein should not be limited based on the described embodiments. Rather, the apparatus and methods described herein should only be limited in light of the claims that follow when taken in conjunction with the above description and accompanying drawings.

What is claimed is:

1. A data clock control apparatus, comprising:
   a bias voltage generator configured to generate a bias voltage that is adjusted by changing a voltage level according to a plurality of test mode signals and a plurality of fuse signals, which are activated; and
   a clock signal controller supplied with the bias voltage, and configured to buffer an external clock signal and output a data output clock signal.

2. The data clock control apparatus of claim 1, wherein the bias voltage generator comprises:
   a first voltage adjusting unit configured to receive a first test mode signal and a first fuse signal and to output a first drop voltage;
   a second voltage adjusting unit configured to receive a second test mode signal and a second fuse signal and to output a second drop voltage;
   a voltage supply unit configured to supply the bias voltage according to activation of the first and second voltage adjusting units; and
   a reference voltage generating unit configured to generate a reference voltage to activate the voltage supply unit.

3. The data clock control apparatus of claim 2, wherein the first voltage adjusting unit is configured to generate the first drop voltage in response to an activated level of the first test mode signal or the first fuse signal.

4. The data clock control apparatus of claim 2, wherein the second voltage adjusting unit is configured to generate the second drop voltage in response to an activated level of the second test mode signal or the second fuse signal.

5. The data clock control apparatus of claim 2, wherein the voltage supply unit is configured to generate a voltage level, activated by the reference voltage and adjusted according to the operation of the first and second voltage adjusting units, as the bias voltage.

6. The data clock control apparatus of claim 5, wherein the voltage supply unit includes an NMOS transistor, and wherein the NMOS transistor includes a gate to which the reference voltage is applied, a source that is connected to a bulk bias power supply, and a drain to which the bias voltage is applied.

7. The data clock control apparatus of claim 2, wherein one end of the reference voltage generating unit is connected to the external driving power supply, and the other end thereof is connected to a bulk bias power supply.

8. The data clock control apparatus of claim 2, wherein an operation upper-limit potential of the bias voltage is a positive potential, and wherein the bias voltage generator further comprises a level shifter.

9. The data clock control apparatus of claim 1, wherein an operation lower-limit potential is applied to the clock signal controller as the bias voltage, and wherein the clock signal controller includes:
 a clock input buffer configured to receive and buffer the external clock signal to output an internal clock signal, and
 a pulse generator configured to receive the internal clock signal to output the data output clock signal as a pulse signal.

10. A semiconductor integrated circuit, comprising:
 a data output clock generating unit supplied with a bias voltage whose voltage level is adjusted according to a plurality of test mode signals and a plurality of fuse signals, which are activated, and to output a data output clock signal; and
 a data output buffer unit configured to output data in synchronization with the data output clock signal and output the data stably even though a voltage of an external driving power supply is changed.

11. The semiconductor integrated circuit of claim 10, wherein the data output clock generating unit comprises:
 a bias voltage generator configured to receive the plurality of test mode signals and the plurality of fuse signals and to generate the bias voltage; and
 a clock signal controller configured to buffer the external clock signal and output the data output clock signal, and wherein the bias voltage is applied at an operation lower-limit potential of the clock signal controller.

12. The semiconductor integrated circuit of claim 11, wherein the bias voltage generator comprises:
 a first voltage adjusting unit configured to receive a first test mode signal and a first fuse signal and to provide a first drop voltage;
 a second voltage adjusting unit configured to receive a second test mode signal and a second fuse signal and to provide a second drop voltage;
 a voltage supply unit configured to supplies the bias voltage according to whether the first and second voltage adjusting units are activated or not; and
 a reference voltage generating unit configured to generate a reference voltage to activate the voltage supply unit.

13. The semiconductor integrated circuit of claim 12, wherein the first voltage adjusting unit can be configured to provide the first drop voltage in response to an activated level of the first test mode signal or the first fuse signal.

14. The semiconductor integrated circuit of claim 12, wherein the second voltage adjusting unit can be configured to provide the second drop voltage in response to an activated level of the second test mode signal or the second fuse signal.

15. The semiconductor integrated circuit of claim 12, wherein the voltage supply unit can be activated by the reference voltage, and can be configured to provide a voltage level, which is adjusted according to the operation of the first and second voltage adjusting units, as the bias voltage.

16. The semiconductor integrated circuit of claim 15, wherein the voltage supply unit includes an NMOS transistor, and wherein the NMOS transistor includes a gate to which the reference voltage is supplied, a source that is connected to a bulk bias power supply, and a drain to which the bias voltage is applied.

17. The semiconductor integrated circuit of claim 12, wherein one end of the reference voltage generating unit is connected to the external driving power supply, and the other end thereof is connected to a bulk bias power supply.

18. The semiconductor integrated circuit of claim 12, wherein the operational upper-limit potential of the bias voltage is a positive potential, and wherein the bias voltage generator further includes a level shifter.

19. The semiconductor integrated circuit of claim 10, wherein the data output buffer unit includes:
 a pre driver configured to receive the data; and
 an output driver that is pulled up or pulled down according to an output signal of the pre driver and configured to supply the data to an input/output pad.

20. The semiconductor integrated circuit of claim 19, wherein the data is read from memory cells by an address signal that is input from the outside of the semiconductor integrated circuit.

* * * * *